(12) United States Patent
Lao et al.

(10) Patent No.: US 6,509,801 B1
(45) Date of Patent: Jan. 21, 2003

(54) MULTI-GIGABIT-PER-SEC CLOCK RECOVERY APPARATUS AND METHOD FOR OPTICAL COMMUNICATIONS

(75) Inventors: Binneg Y. Lao, Rancho Palos Verdes, CA (US); David A. Rowe, Torrance, CA (US); James R. Pulver, Torrance, CA (US)

(73) Assignee: Sierra Monolithics, Inc., Redondo Beach, CA (US)

( * ) Notice: Subject to any disclaimer, the term of this patent is extended or adjusted under 35 U.S.C. 154(b) by 0 days.

(21) Appl. No.: 09/895,955

(22) Filed: Jun. 29, 2001

(51) Int. Cl.$^7$ .................................................. H03L 7/00
(52) U.S. Cl. ............................................ 331/17; 331/1 A
(58) Field of Search .............................. 331/1 A, 17, 25

(56) References Cited

U.S. PATENT DOCUMENTS

| | | | |
|---|---|---|---|
| 4,371,975 A | 2/1983 | Dugan | 375/120 |
| 4,404,680 A | 9/1983 | Perkins | 375/362 |
| 4,456,890 A | 6/1984 | Carickhoff | 331/1 A |
| 4,972,161 A | 11/1990 | Davies et al. | 331/1 A |
| 4,984,255 A | 1/1991 | Davis et al. | 375/354 |
| 5,027,085 A | 6/1991 | De Vito | 331/1 A |
| 5,124,669 A | 6/1992 | Palmer et al. | 331/1 A |
| 5,131,014 A | 7/1992 | White | 375/119 |
| 5,220,294 A * | 6/1993 | Ichikawa | 331/1 A |
| 5,315,270 A | 5/1994 | Leonowich | 331/1 A |
| 5,329,559 A | 7/1994 | Wong et al. | 375/119 |
| 5,451,894 A | 9/1995 | Guo | 327/241 |
| 5,473,639 A | 12/1995 | Lee et al. | 375/376 |
| 5,508,660 A | 4/1996 | Gersbach et al. | 331/17 |
| 5,592,125 A | 1/1997 | Williams | 331/1 A |
| 5,619,161 A | 4/1997 | Novof et al. | 327/535 |
| 5,694,062 A | 12/1997 | Welch et al. | 327/3 |
| 5,740,213 A | 4/1998 | Dreyer | 375/374 |
| 5,847,614 A | 12/1998 | Gilbert | 331/14 |
| 5,889,828 A * | 3/1999 | Miyashita et al. | 327/154 |
| 5,945,855 A | 8/1999 | Momtaz | 327/157 |
| 5,950,115 A | 9/1999 | Momtaz et al. | 455/73 |
| 6,028,903 A | 2/2000 | Drost et al. | 375/360 |
| 6,034,554 A | 3/2000 | Francis et al. | 327/7 |
| 6,124,741 A | 9/2000 | Arcus | 327/112 |
| 6,147,530 A * | 11/2000 | Nogawa | 327/107 |
| 6,154,017 A * | 11/2000 | Contreras | 323/315 |

* cited by examiner

Primary Examiner—Terry D. Cunningham
Assistant Examiner—Quan Tra
(74) Attorney, Agent, or Firm—Soyeon P. Laub

(57) ABSTRACT

Methods and apparatus for generating clock signals accurately locked to multi-gigabits-per-second data signals received over fiber optic channels are disclosed. The invention includes a phase detector for comparing a data signal and a clock signal, a one shot unit for detecting a data transition, an XOR, a filter, a main charge pump, a compensating charge pump for producing additive or compensating current, and a VCO for generating the clock signal. The phase detector includes multiple D-flip flops. The one shot unit includes a delay unit and an AND gate. The filter includes a resistor, a capacitor and a negative resistance amplifier. The main charge pump includes differential inputs, double outputs, cross-quading resistors, differential NPN input transistors, and a current source. The compensating charge pump includes differential NPN input transistors and a current source. In operation, when there is a data transition and if the clock signal and data signal are out of phase synchronization, then the compensating charge pump will enhance the operation of the main charge pump, and the VCO will speed up or slow down the clock signal depending on whether the clock signal is advanced or retarded in phase compared to the data signal. When there is no data transition, the compensating charge pump will in effect counterbalance the operation of the main charge pump, and the frequency of the clock signal will be maintained at the same level it was at the onset of the no data transition period.

28 Claims, 7 Drawing Sheets

|      | data transition | | no data transition | |
| --- | --- | --- | --- | --- |
| QF   | 1    | 1    | 0    | 0    |
| QC   | 1    | 0    | 1    | 0    |
| QG   | 0    | 1    | 1    | 0    |
| T1   | off  | on   | off  | on   |
| T2   | on   | off  | on   | off  |
| T3   | off  | on   | on   | off  |
| T4   | on   | off  | off  | on   |
| N2   | high | low  | med  | med  |
| N3   | low  | high | med  | med  |

MULTI-GIGABIT-PER-SEC CLOCK RECOVERY APPARATUS AND METHOD FOR OPTICAL COMMUNICATIONS

FIELD OF THE INVENTION

The invention relates to clock recovery apparatus and methods, and more specifically to apparatus and methods for generating clock signals accurately locked to multi-gigabits-per-second data signals received over fiber optic channels.

BACKGROUND OF THE INVENTION

Recently, the world has witnessed a phenomenal growth in the number of Internet users, applications and devices and in the amount of data traffic especially that of medium-rich content—all demanding higher speed communications and connectivity over the Internet. To accommodate this demand, the Internet utilizes fiber optic channels for ultra high speed communications. The optical signals sent along the fiber optic channels are received by receivers that include both optical components and electrical components. The receivers convert the optical signals to electrical signals and send the converted electrical signals to electronic computer networks operating at lower speeds for processing data.

After an optical signal is converted to an electrical signal, a receiver recovers a clock signal and data within a clock and data recovery unit. A clock and data recovery unit typically includes a phase locked loop such as the phase locked loop 10 in FIG. 1. A phase locked loop is essential in synchronizing a clock signal with data received from the fiber optic channels. The phase locked loop 10 includes a phase detector 11, a charge pump 12, a filter 13, and a voltage controlled oscillator (VCO) 14. The purpose of a phase detector is to compare the phase of data (such as data 15) with that of a clock signal received from a VCO and determine whether the clock signal is ahead or retarded in comparison with the data. The charge pump 12 either provides current to the filter 13 or sinks current depending on the result of the comparison done by the phase detector. The filter 13 provides a voltage to the VCO 14 to either speed up or slow down the clock signal generated by the VCO 14. One of the major problems with the traditional non-tristate phase locked loops, however, is that when data includes a long stream of one's or zero's, the filter may continue to charge up causing the VCO frequency to drift. This could degrade the jitter performance or even result in bit errors in reading the data.

Accordingly, there is a need for a phase locked loop that is capable of maintaining a constant clock frequency during periods when the data includes a long stream of one's or zero's. The phase locked loop should be simple in its implementation to reduce the complexity, power consumption, and cost and should provide good jitter performance even at multi-gigabits-per-second data rates.

SUMMARY OF THE INVENTION

The present invention provides clock recovery methods and apparatus for maintaining a constant clock frequency during periods when multi-gigabits-per-second data signals received over fiber optic channels include a long stream of one's or zero's. In accordance with one embodiment, the present invention includes a phase detector for receiving and comparing a data signal and a clock signal, a one-shot unit for detecting a data transition, an XOR (exclusive OR) gate for generating an appropriate control signal in response to the output signals of the phase detector and the one-shot unit, a double-ended filter, a main differential charge pump for producing current, a compensating differential charge pump for producing additive or canceling current either to charge or discharge the filter or not to affect the filter, and a voltage controlled oscillator for generating the clock signal in response to the voltage level produced across the filter.

In accordance with one embodiment, the phase detector may be implemented with multiple D-flip flops. The one-shot unit may include a delay unit and an AND gate. The filter may include a resistor and a capacitor and further include a negative resistance amplifier. The main differential charge pump may receive input signals from the phase detector and produce double outputs. It may include cross-quading resistors, differential NPN input transistors, and a current source. The compensating differential charge pump may have its outputs coupled to the outputs of the main differential charge pump and receive input signals from the XOR. The compensating differential charge pump may also include differential NPN input transistors and a current source.

In an exemplary operation, when there is a data transition and if the clock signal and data signal are out of phase synchronization, then the compensating differential charge pump will add to or subtract from the filter charges that are equal in sign and quantity to those produced by the main differential charge pump. This is accomplished by adding the current produced by the compensating differential charge pump to the current produced by the main differential charge pump. The filter is then either charged or discharged and in turn the voltage controlled oscillator will speed up or slow down the clock signal it produces depending on whether the clock signal is advanced or retarded in phase compared to the data signal.

In another exemplary operation, when there is no data transition, the operation of the compensating differential charge pump will in effect cancel the operation of the main differential charge pump by producing a current that is equal in quantity but opposite in sign to the current produced by the main differential charge pump. In this case, the filter is neither charged nor discharged and in turn the speed of the clock signal or its frequency is maintained at the same level it was at the onset of the no data transition period.

According to the present invention, a method for recovering a clock signal from data may include receiving data and producing a clock signal, detecting a transition in the data, comparing the phase of the data to the phase of the clock signal, producing a charging or discharging current to the first end and second end of a filter when there is a data transition and if the clock signal and the data are out of phase synchronization, producing no charging or discharging current at the first and second ends of a filter when there is no data transition, speeding up the clock signal when there is a transition in the data and if the clock signal is retarded in phase compared to the data, slowing down the clock signal when there is a transition in the data and if the clock signal is advanced in phase compared to the data, and maintaining the speed or frequency of the clock signal at the level it was at the commencement of the no data transition period when there is no transition in the data.

DETAILED DESCRIPTION OF THE INVENTION

The present invention provides clock recovery methods and apparatus for generating clock signals accurately locked to multi-gigabits-per-second data signals received over fiber optic channels. In the following detailed description, numerous specific details are set forth to provide a full understanding of the present invention. It will be obvious, however, to one skilled in the art that the present invention may be practiced without some of these specific details. In other instances, well-known structures and techniques have not been shown in detail so as to avoid unnecessarily obscuring the present invention.

Figure 1:
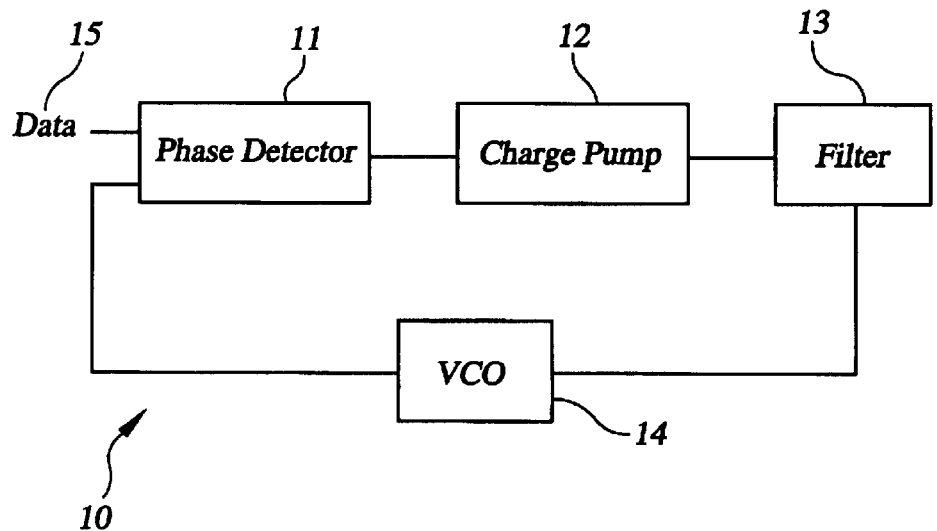
FIG. 1 is a block diagram representing a typical phase locked loop.
Figure 2:
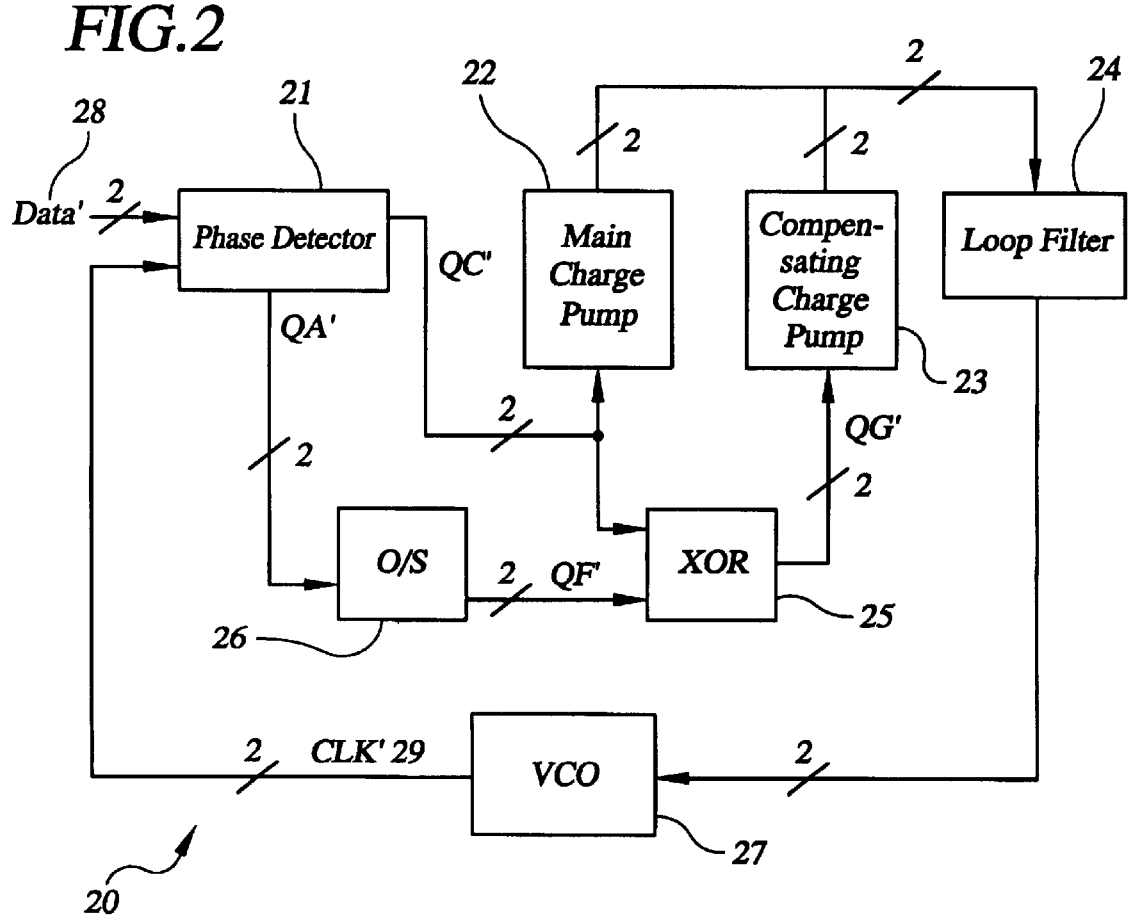
FIG. 2 is a block diagram representing an exemplary phase locked loop in accordance with one embodiment of the present invention.

Now referring to FIG. 2, a block diagram of the present invention according to one embodiment is presented. One embodiment of the present invention includes a tri-state phase locked loop. A phase locked loop 20 in FIG. 2 includes a phase detector 21, a main charge pump 22, a compensating charge pump 23, a loop filter 24, an XOR 25, a one-shot unit 26, and a VCO 27. While it is not shown in FIG. 2, an amplifier (or buffer) can be placed between the loop filter 24 and the VCO 27. In FIG. 2, differential lines are shown (e.g., between phase detector 21 and main charge pump 22, between phase detector 21 and one-shot unit 26, between loop filter 24 and VCO, between VCO 27 and phase detector 21, etc.). Some or all of these may be single ended connections in alternative embodiments. The phase locked loop 20 can be used in many telecommunications applications and in particular in clock data recovery units of receivers that receive optical signals from fiber optic channels and that meet the optical standards that have emerged.

One such standard is the Synchronous Optical Networks (SONET) which is a standard formulated by the Exchange Carriers Standards Association (ECSA) for the American National Standards Institute (ANSI). The SONET is used for telecommunications and other industries mainly in North America and Japan. Another standard is the Synchronous Digital Hierarchy (SDH) standard which was published by the International Telecommunication Union (ITU) and used in other parts of the world. The phased locked loop 20 can be implemented to receive and process data operating at rates greater than one gigabit-per-second including without limitation the data rates imposed by the OC-192 SONET standard or STM64 SDH Standard (which can be approximately between 9–13 Gbps depending on error correction coding) or by the OC-768 SONET standard or STM 256 SDH Standard (which can be approximately between 36 to 48 Gbps). In alternative embodiments, a phased locked loop may receive and process data operating at rates equal to or less than one gigabit-per-second or rates greater than the OC-768 or STM 256 rates.

Still referring to FIG. 2, in this example, the phase detector 21 receives differential data' 28 including data and data/ that have been converted from optical signals and compares the data against the differential clock signal CLK' 29 generated by the VCO 27. The clock signal frequency will be the same as the data rate (i.e., full rate). For example, if the data rate is 13 Gbps, then the clock signal frequency will be 13 GHz. The operating frequency of the other components shown in FIG. 2 will be the same as the frequency of the clock signal 29. In alternative embodiments, the clock frequency may or may not be different from the data rate, and some or all of the operating frequencies of the various components in a phase locked loop may or may not be different from the clock frequency.

It should be noted that a differential signal includes a non-inverted signal and an inverted signal (or a complementary signal), and the notation "/" is used to indicate a complementary signal. For example, data/ is complement of data, and thus when data is high (1), data/ is low (0). Data and data/ form a complementary pair signal, data', where the symbol "'" denotes the pair nature of the signal.

Figure 3:
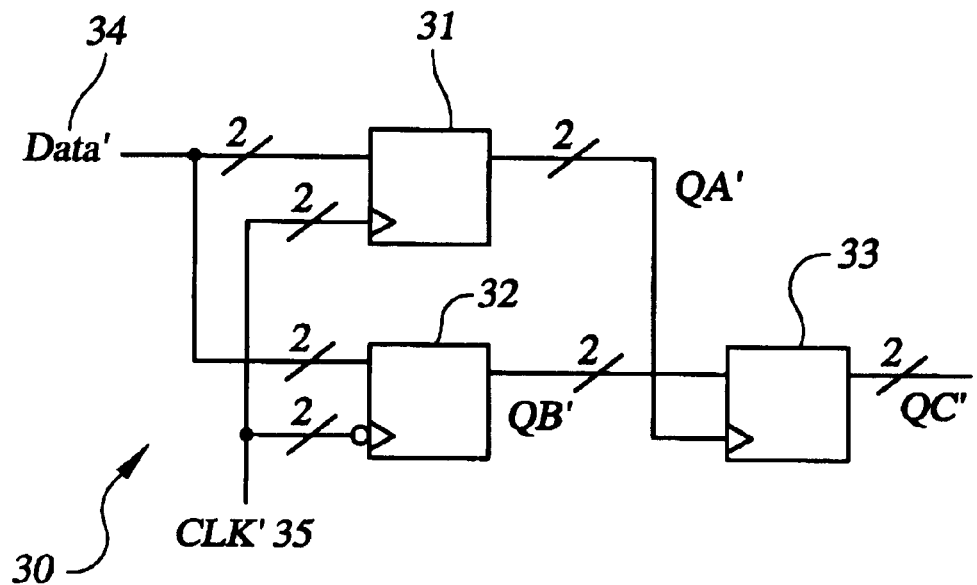
FIG. 3 is an exemplary block diagram of a phase detector.

One embodiment of the phase detector 21 is presented in FIG. 3. While the phase detector 21 may employ one of many different types of phase detectors, in this example, the phase detector 21 uses a bang-bang phase detector that includes a first D-flip flop 31, a second D-flip flop 32 and a third D-flip flop 33. A D-flip flop may function in the following manner: According to one embodiment, at a rising edge of a clock signal CLK' 35, the D-flip flop 31 samples data' 34 and outputs the value of the sampled data as a differential signal QA'. In another embodiment, a flip-flop may sample a signal at a falling edge of a clock signal or sample a signal both at a rising edge and at a falling edge of a clock signal. The D-flip flop 31 receives the differential data' 34 (which includes data and data/) and a differential clock signal CLK' 35 (which includes CLK and CLK/) and outputs a differential signal QA' (which includes QA and QA/). The D-flip flop 32 receives the differential data' 34 and an inverted signal of the differential clock signal CLK' 35 and outputs a differential signal QB' (which includes QB and QB/). The D-flip flop 33 receives the differential signal QA' and the differential signal QB' and outputs a differential signal QC' (which includes QC and QC/). An alternative embodiment of the phase detector can be built where all inputs and outputs are single-ended rather than differential.

Figure 4:
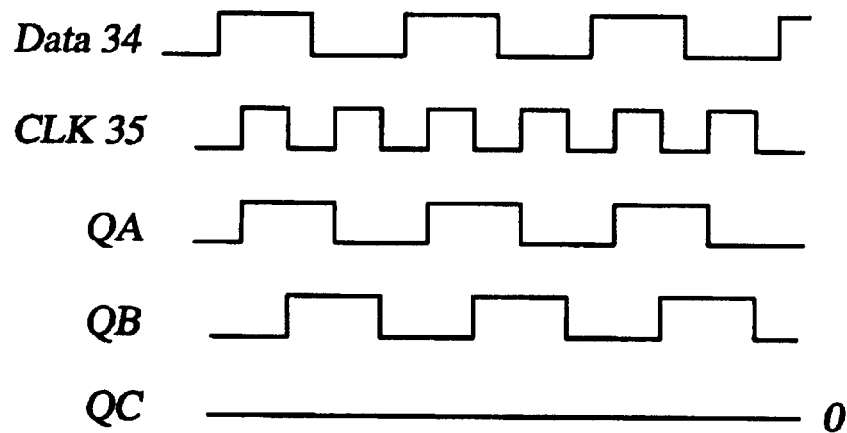
FIG. 4 illustrates exemplary waveforms of signals received or produced by the phase detector in FIG. 3.
Figure 5:
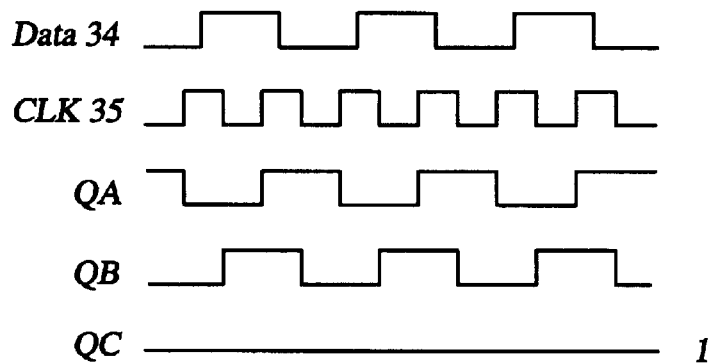
FIG. 5 illustrates another set of exemplary waveforms of signals received or produced by the phase detector in FIG. 3.

FIGS. 4 and 5 show exemplary waveforms of the output signals QA, QB and QC in accordance with one embodiment of the present invention. In this example, each D-flip flop samples its data at a rising edge of a clock signal. In FIG. 4, the data 34 is ahead of the CLK 35, and as a result the output signal QC is low (0). So long as the data 34 is ahead of the CLK 35, even by a small amount, the phase detector 21's output will be low, indicating that the data' 34 is ahead of the clock signal 35. In FIG. 5, the data 34 is behind the CLK 35, and as a result, the output signal QC is high (1). So long as the data 34 is behind the CLK 35, even by a small amount, the phase detector 21's output will be high, indicating that the data' 34 is behind the clock signal CLK' 35 in phase.

Figure 6:
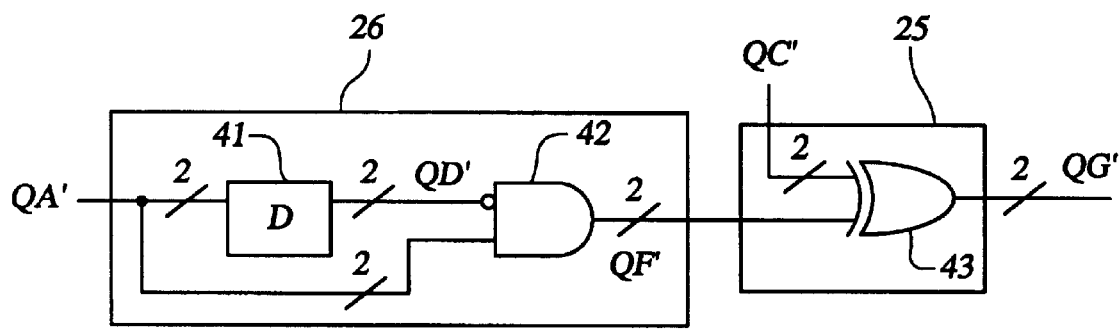
FIG. 6 is an exemplary block diagram of a one-shot unit and an XOR unit in accordance with the present invention.

FIG. 6 is an exemplary block diagram of a control circuit including the one-shot unit 26 and the XOR unit 25 in accordance with one embodiment of the present invention. The one-shot unit 26 includes a delay block 41 and an AND gate 42. In this example, the one-shot unit 26 produces pulses each having duration approximately equal to one data bit (e.g., approximately 80 psec for 12 Gbit/sec data rate) triggered by a rising edge of its input signal (0-to-1 data transition). It should be noted that a one-shot unit may produce pulses (1's or 0's) of different duration and that the pulses may be triggered by a falling edge or by both the rising edge and falling edge of a signal. In the latter case, both data transitions, 0-to-1 and 1-to-0, can be used by a phase locked loop to adjust the loop filter voltage and in turn the phase or the frequency of the VCO. In the current embodiment, without the loss of generality, only the 0-to-1 transitions are utilized to trigger the one-shot, and in turn to adjust the VCO. In another embodiment, the control circuit may be included in a phase detector. Yet in another embodiment, signals of the control circuit may be single-ended rather than differential.

In FIG. 6, the differential signal QA' from the phase detector 21 is used as an input to the delay block 41 and the AND gate 42. One implementation of the delay block 41 includes multiple differential buffers. The delay block 41 delays the differential signal QA' by a predetermined amount that can be adjusted depending on the application. The AND gate 42 receives the differential signal QA' and an inverted signal of the differential signal QD' (which includes QD and QD/) from the delay block 41 and produces a differential signal QF' (which includes QF and QF/). The XOR unit 25 receives the differential signals QC' and QF' and generates a differential signal QG' (which includes QG and QG').

Figure 7:
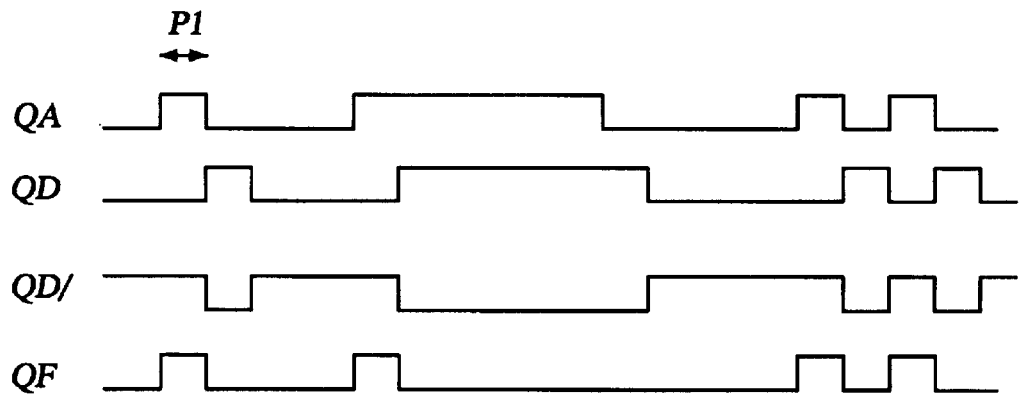
FIG. 7 illustrates exemplary waveforms of signals received or produced by a one-shot unit.

FIG. 7 illustrates exemplary waveforms received or generated by a one-shot unit in accordance with one embodiment of the present invention. In this example, the delay block 41 of FIG. 6 generates the QD signal which is the QA signal delayed by one data bit period (P1). The AND gate 42 of FIG. 6 generates the QF signal which includes 1's each having one data bit period whenever there is a 0-to-1 data transition in the QA signal.

Figures 9, 10:
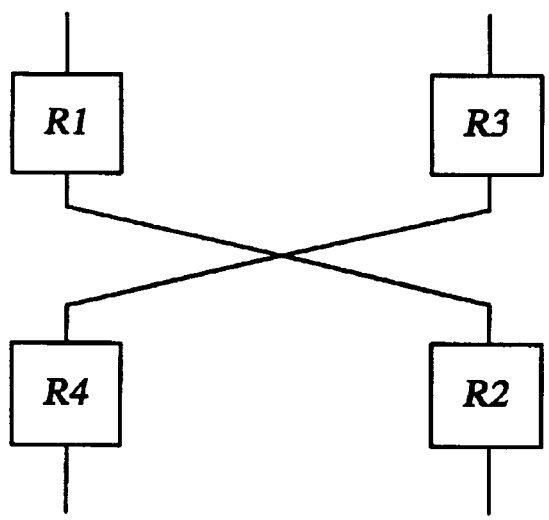
FIG. 9 illustrates exemplary cross-quading of the resistors in a main charge pump according to one embodiment of the present invention.
FIG. 10 is an exemplary chart illustrating the operation of a main charge pump and a compensating charge pump according to one embodiment of the present invention.

Now referring to the first four rows in FIG. 10, it illustrates the relationship between the QC, QF and QG signals according to one embodiment of the invention. When the QF logic signal is 1 indicating that there is a 0-to-1 data transition, the QG logic signals are opposite of the QC logic signals. When the QF logic signal is 0 indicating that there is no data transition, the QG logic signals are the same as the QC logic signals. A QC signal is used as an input signal of the main charge pump 22 in FIG. 2, and a QG signal is used as an input signal of the compensating charge pump 23.

Figure 8:
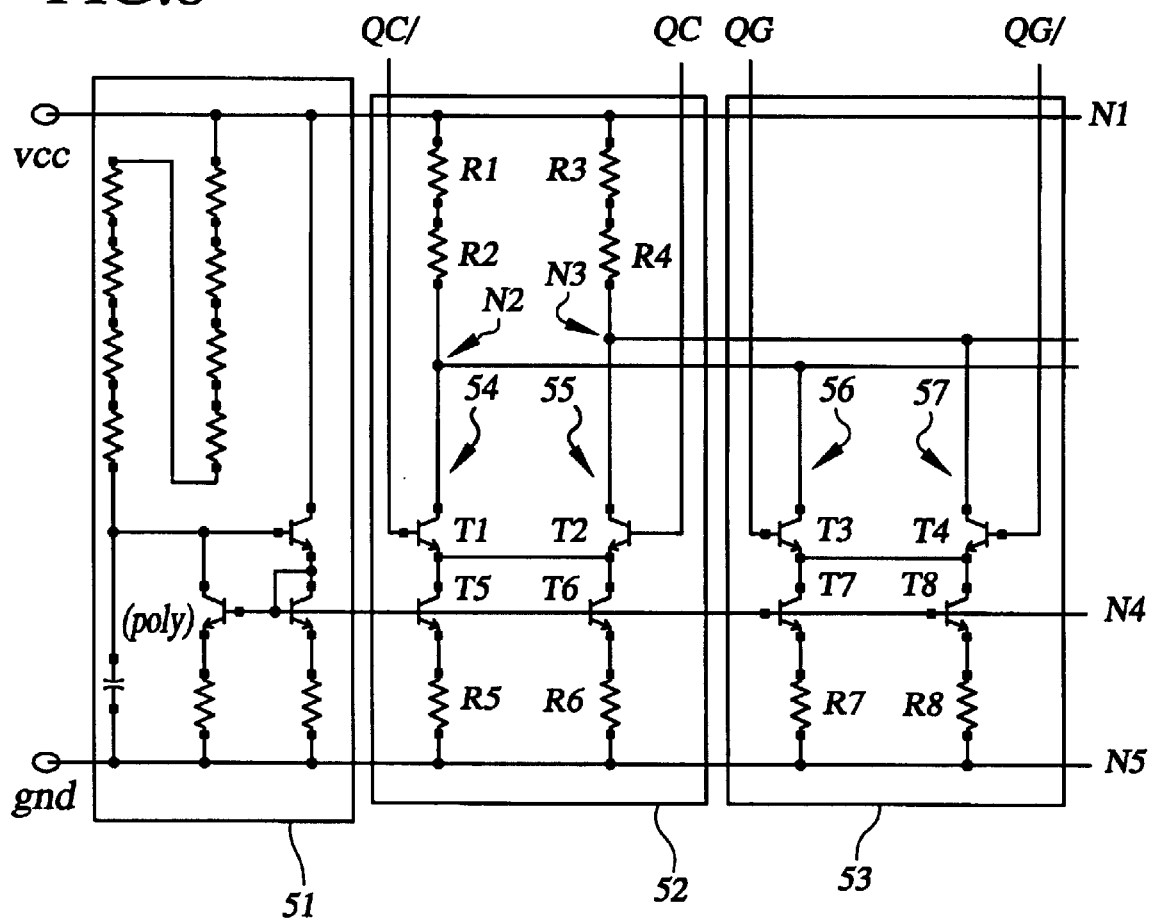
FIG. 8 is an exemplary circuit schematic of a main charge pump and a compensating charge pump according to one embodiment of the present invention.

FIG. 8 is an exemplary circuit schematic of a main charge pump and a compensating charge pump according to one embodiment of the present invention. A main charge pump includes a current mirror 51 and a main differential amplifier 52. The main differential amplifier 52 receives differential input signals QC and QC/ from the phase detector 21 in FIG. 2 and includes differential output nodes N2 and N3 and two current paths 54 and 55. The main differential amplifier 52 further includes resistors R1 and R2 connected in series between Vcc and the node N2 and resistors R3 and R4 connected in series between Vcc and the node N3. The main differential amplifier 52 further includes a first input transistor T1 and a second input transistor T2. In this example, T1 and T2 are NPN transistors. As to the transistor T1, its collector is connected to the node N2 and its base receives the QC/ signal. As to the transistor T2, its collector is connected to the node N3 and it base receives the QC signal. The emitters of T1 and T2 are coupled to each other. The differential amplifier 52 further includes current source transistors and resistors T5, T6, R5 and R6. The current source transistors and resistors are connected to the emitters of T1 and T2 and the current mirror 51. In this example, the transistors T5 and T6 are NPN transistors.

Still referring to FIG. 8, a compensating charge pump includes a compensating differential amplifier 53. The compensating differential amplifier 53 receives differential input signals QG and QG/ from the XOR 25 in FIG. 2 and includes the nodes N2 and N3 and two current paths 56 and 57. The compensating differential amplifier 53 further comprises a third input transistor T3 and a fourth input transistor T4. In this example, T3 and T4 are NPN transistors. As to the transistor T3, its collector is connected to the node N2 and its base receives the QG signal. As to the transistor T4, its collector is connected to the node N3 and it base receives the QG/ signal. The emitters of T3 and T4 are coupled to each other. The differential amplifier 53 further includes current source transistors and resistors T7, T8, R7 and R8. The current source transistors and resistors are connected to the emitters of T3 and T4 and the current mirror 51. In this example, the transistors T7 and T8 are NPN transistors. In another embodiment, the compensating charge pump may be included in the main charge pump.

To optimize performance and exact compensation, the sizes and characteristics of the devices should be made the same (e.g., R1–R4 should be the same; T1–T4 should be the same; T5–T8 should be the same; and R5–R8 should be the same). Furthermore, for integrated circuit implementation, the placement of the devices should be symmetrical to minimize thermal gradient and process gradient. For example, the resistors R1–R4 are placed as shown in FIG. 9 (cross-quading).

Figure 11:
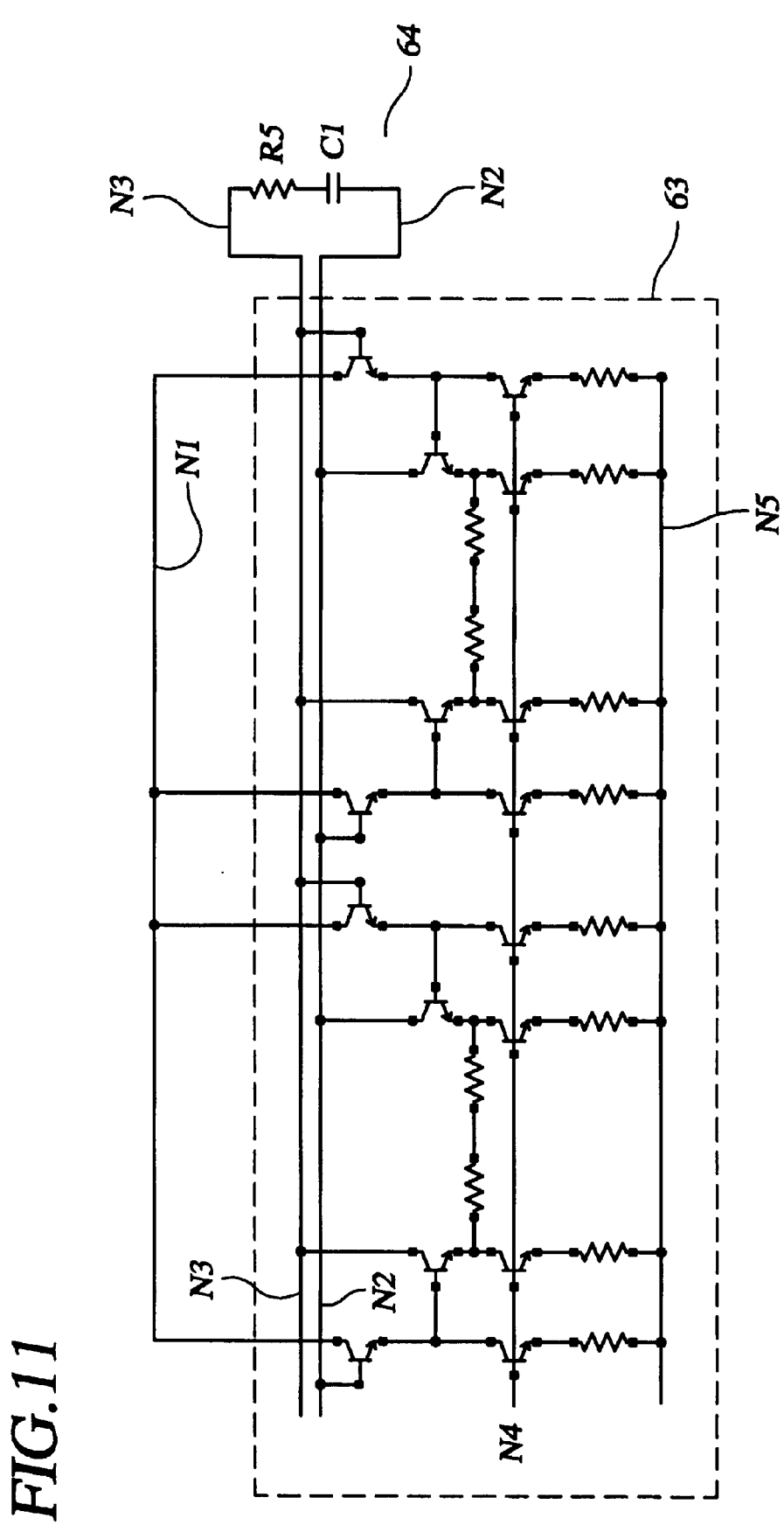
FIG. 11 illustrates one embodiment of a loop filter with a negative impedance amplifier in accordance with the present invention.
Figure 12:
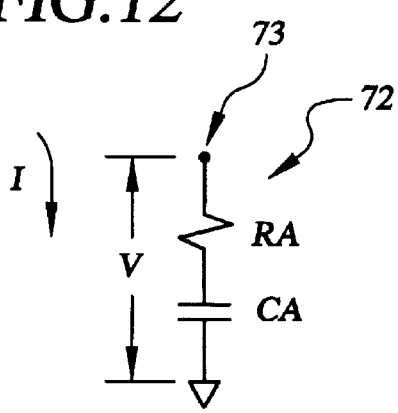
FIG. 12 shows one representation of a single-ended filter.

FIG. 11 illustrates one embodiment of a loop filter in accordance with the present invention. The loop filter comprises a negative impedance amplifier 63 and a RC unit 64 across the nodes N2 and N3. The charge pumps shown in FIG. 8 produce charging currents, and the capacitor C1 in the loop filter in FIG. 11 converts the currents to a voltage. The negative impedance amplifier compensates the leakage current of capacitor C1 through resistors R1–R4 and helps to maintain the charge in the capacitor C1. In this example, the RC unit 64 is a double-ended filter (see FIG. 13) rather than a single-ended filter (see FIG. 12). As shown in FIG. 12, a single-ended filter 72 includes a resistor RA and a capacitor CA, and one end of the filter is connected to the ground. Establishing a voltage across the filter is relatively simple. A current comes into the filter 72 and charges the capacitor CA, and the voltage is established across the filter 72 between the node 73 and the ground. While a double-ended filter is more preferable over a single-ended filter, a single-ended filter may be employed in another embodiment. In an alternative embodiment, the negative impedance amplifier may be included in the main charge pump or the compensating charge pump instead of being included in the loop filter.

Figure 13:
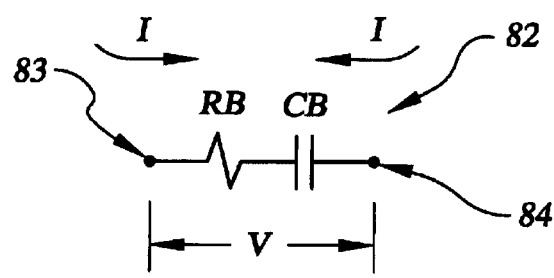
FIG. 13 shows one representation of a double-ended filter.
Figure 14:
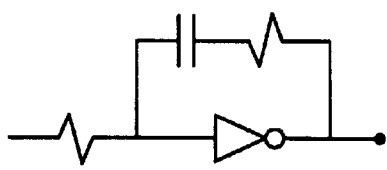
FIG. 14 shows another embodiment of a double-ended filter.

Now referring to FIG. 13, a double-ended filter 82 includes a resistor RB and a capacitor CB, and neither end of the filter is connected to the ground. Establishing a voltage across the filter 82 is not as simple as that of a single-ended filter because the filter 82 is not directly connected to a ground or power. A current can come into the filter 82 through either end of the filter (the node 83 or the node 84). FIG. 14 illustrates another embodiment of a double-ended filter. It should be noted that there are many other ways of implementing a double-ended filter and a single-ended filter.

Figure 15:
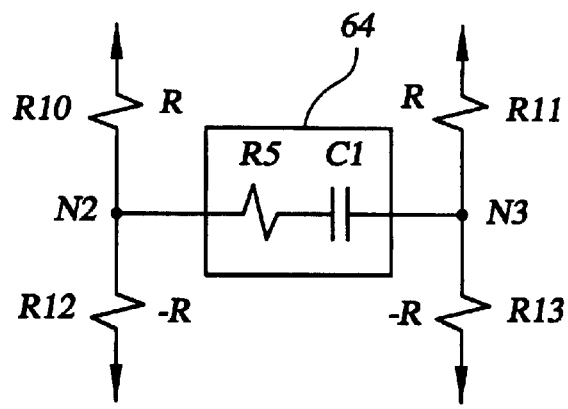
FIG. 15 represents one exemplary AC equivalent circuit for a double-ended filter in conjunction with a negative impedance amplifier in accordance with one embodiment of the present invention.

FIG. 15 illustrates the operation of the negative impedance amplifier in conjunction with the RC unit 64. FIG. 15 displays the AC equivalent circuit around nodes N2 and N3. The resistors R1 and R2 in FIG. 8 can be represented as R10 in FIG. 15. The resistors R3 and R4 in FIG. 8 can be represented as R11 in FIG. 15. The negative impedance amplifier 63 in FIG. 11 can be represented as R12 and R13 in FIG. 15. The negative impedance of R12 and R13 in effect cancels the positive impedance of R10 and R11 as follows. Note in FIG. 15 that all resistors are connected to signal ground. The negative impedance R12 is therefore electrically in parallel with R10 and similarly R11 is in parallel with R13. The impedance between N2 and ground, $1/(1/R-1/R)$, is therefore very large. It is as if R12 had canceled the existence of R10 leaving N2 essentially isolated from signal ground. A similar analysis applies to N3 and ground. This allows C1 to minimize its leakage current to signal ground and to hold its charge and the voltage across itself when the main charge pump and the compensating charge pump cancel each other during a period when there is no data transition. When the voltage across C1 is constant, the VCO output frequency remains constant as desired. Not shown in FIG. 15 but still connected to N2 and N3 are the collector resistances of T1–T4 in FIG. 8. They are very large and therefore omitted without affecting the functionality of the RC filter 64.

The operation of the charge pumps in FIG. 8 and the loop filter in FIG. 11 is illustrated below according to one embodiment of the present invention. When there is a data transition, the compensating charge pump will enhance the operation of the main charge pump (e.g., the current produced by the compensating charge pump will add to the current produced by the main charge pump). When there is a data transition, and the clock signal is ahead or behind the data, the net current produced by the main charge pump and the compensating charge pump will not be zero. The non-zero current will charge or discharge the filter unit 64 causing the voltage across nodes N2 and N3 to change. Such change will then cause the clock signal from the VCO to slow down in case it is ahead of the data or speed up in case it is behind the data thus accomplishing the phase locking function. When there is no data transition, there is no way to compare the phases of the clock signal and the data. In this case the compensating charge pump will produce a current that will in effect compensate (e.g., counterbalance or cancel) the current produced by the main charge pump so that the filter unit 64 is neither charged nor discharged (e.g., the voltage across nodes N2 and N3 will remain the same or constant).

Now referring to FIGS. 2, 8, 10 (second and third columns) and 11, the operation of the charge pumps and loop filter is described in detail when there is a data transition in accordance with one embodiment of the present invention. The QF signal from the one-shot unit 26 will be high (1), and the QC and QC/ signals which are the input signals to the main differential amplifier 52 will be the opposite of the QG and QG/ signals which are the input signals to the compensating differential amplifier 53. When QC is high (1) and QC/ is low (0), indicating that the clock signal CLK' 29 is ahead of the data' 28, QG is low (0) and QG/ is high (1). Accordingly, T1 and T3 will be off, and T2 and T4 will be on. So the current will flow through the current paths 55 and 57. No current will flow through the current paths 54 and 56. Hence, node N2 will be pulled toward Vcc (at N1), and the voltage at the node N3 will be pulled toward ground (at N5) due to current paths 55 and 57. The compensating differential amplifier 53 enhances the operation of the main differential amplifier 52 by (i) shutting off its current path 56 coupled to the current path 54 of the main differential amplifier 52 (which is also off) and (ii) adding current through its current path 57 coupled to the current path 55 of the main differential amplifier 52. Pulling N2 toward Vcc (at N1) and N3 toward ground (at N5) serves to discharge C1 in the filter 64.

When QC is low (0) and QC/ is high (1), indicating that the clock signal CLK' 29 is behind the data' 28, QG is high (1) and QG/ is low (0). Accordingly, T1 and T3 will be on, and T2 and T4 will be off. The current will flow through the current paths 54 and 56, and no current will flow through the current paths 55 and 57. The voltage at the node N2 will be pulled toward ground (at N5) due to the current flowing through the paths 54 and 56, and the voltage at the node N3 will be pulled toward Vcc (at N1) due to lack of current in paths 55 and 57. The compensating differential amplifier 53 again enhances the operation of the main differential amplifier 52 by (i) shutting off its current path 57 coupled to the current path 55 of the main differential amplifier 52 (which is also off) and (ii) adding current through its current path 56 coupled to the current path 54 of the main differential amplifier 52. Pulling N2 toward ground and N3 toward Vcc serve to charge C1 in Filter 64.

Therefore, when there is a data transition, and the clock signal is either ahead or behind the data, the compensating differential amplifier will enhance the operation of the main differential amplifier. A current will flow into the capacitor C1 through N3 or N2 depending on whether the clock signal is ahead or behind. The capacitor C1 in filter unit 64 will be either discharged or charged and the voltage across the nodes N2 and N3 will be decreased or increased, respectively, as a result. In response to the decrease or increase in the voltage across capacitor C1 of the filter unit 64, the VCO 27 in FIG. 2 will slow down the clock signal 29 if the clock signal is ahead in phase compared to the data, or speed up the clock signal 29 if the clock signal is behind in phase compared to the data.

Now referring to FIGS. 2, 8, 10 (fourth and fifth columns) and 11, the operation of the charge pumps and loop filter is described in detail when there is no data transition (e.g., data 34 stays at 1's or 0's) in accordance with one embodiment of the present invention. In this instance, the QF signal from the one-shot unit 26 will be low (0), and the QC and QC/ signals which are the input signals to the main differential amplifier 52 will be the same as the QG and QG/ signals which are the input signals to the compensating differential amplifier 53. When QC is high (1) and QC/ is low (0), QG is high (1) and QG/ is low (0). T2 and T3 will be on, and T1 and T4 will be off. The current will flow through the current paths 55 and 56 and the resistors R1, R2, R3 and R4. No current will flow through the current paths 54 and 57. The currents through path 55, R3, R4 and through path 56, R1, R2 are quiescent currents. No net currents will flow into or out of filter 64 connected to node N2 and node N3. The capacitor C1 in filter 64 is neither being charged nor discharged by the currents. Hence, the voltage across nodes N2 and N3 will remain constant and equal to whatever it was at the beginning of the no data transition period. The operation of the compensating differential amplifier 53 thus in effect compensates the operation of the main differential amplifier 52 by (i) shutting off its current path 57 coupled to the current path 55 of the main differential amplifier 52 (which is on) and (ii) turning on its current path 56 coupled to the current path 54 of the main differential amplifier 52 (which is off).

When QC is low (0) and QC/ is high (1), QG is low (0) and QG/ is high (1). T1 and T4 will be on, and T2 and T3 will be off. The current will flow through the current paths 54 and 57 and the resistors R1, R2, R3 and R4. No current will flow through the current paths 55 and 56. Hence, the voltage across the node N2 and node N3 will remain constant and equal to whatever it was at the beginning of the no data transition period. The compensating differential amplifier 53 thus in effect compensates the operation of the main differential amplifier 52 by (i) shutting off its current path 56 coupled to the current path 54 of the main differential amplifier 52 (which is on) and (ii) turning on its current path 57 coupled to the current path 55 of the main differential amplifier 52 (which is off).

Therefore, when there is no data transition, the compensating differential amplifier will in effect compensate or cancel the operation of the main differential amplifier, the filter unit 64 will not be charged or discharged, and the voltages across the nodes N2 and N3 will remain constant. The VCO 27 in FIG. 2 in turn will not change, and the speed or the frequency of the clock signal 29 will maintain at the level it was prior to entering into the no data transition period (or at the onset of the no data transition period depending on how the no data transition period is defined).

According to one embodiment, the present invention is implemented as a monolithic integrated circuit. While the invention currently uses the SiGe BiCMOS technology, it may be implemented using other technologies such as the III-V technologies (e.g., InP, GaAs, InGaAs). In the current implementation, bipolar transistors (in particular, NPN transistors) are preferred over MOSFETs to achieve the high clock and data rates.

While the present invention has been particularly described with reference to the various figures and embodiments, it should be understood that these are for illustration only and should not be taken as limiting the scope of the invention. There may be many other ways to implement the invention. Many changes and modifications may be made to the invention, by one having ordinary skill in the art, without departing from the spirit and scope of the invention.

What is claimed is:

1. A clock recovery apparatus comprising:
   a phase detector for receiving a data signal and a clock signal;
   a one-shot coupled to said phase detector;
   an XOR coupled to said phase detector and said one shot circuit;
   a first charge pump coupled to said phase detector and said XOR;
   a second charge pump coupled to said first charge pump and said XOR;
   a filter coupled to said first charge pump and said second charge pump; and
   a voltage controlled oscillator coupled to said filter and said phase detector, said voltage controlled oscillator for generating said clock signal.

2. A clock recovery apparatus according to claim 1,
   wherein said first charge pump includes a first differential amplifier,
   wherein said first differential amplifier includes:
      a first output node and a second output node;
      a first resistor coupled to said first output node;
      a first transistor for receiving an input from said phase detector, said first transistor coupled to said first output node;
      a second resistor coupled to said second output node;
      a second transistor for receiving an input from said phase detector, said second transistor coupled to said second output node and said first transistor; and
      a first current source coupled to said first and second transistors,
   wherein said second charge pump includes a second differential amplifier,
   wherein said second differential amplifier includes:
      a third transistor for receiving an input from said XOR, said third transistor coupled to said first output node;
      a fourth transistor for receiving an input from said XOR, said fourth transistor coupled to said second output node and said third transistor; and
      a second current source coupled to said third and fourth transistors,
   wherein said filter is coupled between said first output node and said second output node.

3. A clock recovery apparatus according to claim 1, wherein said first charge pump and said second charge pump include NPN transistors.

4. A clock recovery apparatus according to claim 1, wherein said first charge pump includes cross-quading resistors.

5. A clock recovery apparatus according to claim 1, wherein said first charge pump and said second charge pump include Si and Ge.

6. A clock recovery apparatus according to claim 1, wherein a frequency of said clock signal generated by said voltage controlled oscillator is greater than one GHz.

7. A clock recovery apparatus according to claim 1, wherein a frequency of said clock signal generated by said voltage controlled oscillator is greater than eight GHz.

8. A clock recovery apparatus according to claim 1,
   wherein said filter includes negative impedance,
   wherein said filter is not directly connected to a ground.

9. A clock recovery apparatus according to claim 1,
   wherein said second charge pump produces a current that is added to a current produced by said first charge pump when there is a transition in said data signal and if said data signal and said clock signal are out of phase synchronization,
   wherein said second charge pump produces a current that in effect counterbalances a current produced by said first charge pump when there is no transition in said data signal.

10. A differential circuit used for recovering a clock signal from data comprising:
   a first differential charge pump having first differential inputs and first double outputs;
   a second differential charge pump coupled to said first differential charge pump, said second differential charge pump having second differential inputs and second double outputs;
   said first double outputs having a first node and a second node;

said second double outputs having a third node and a fourth node, wherein said first node is coupled to said third node, and said second node is coupled to said fourth node; and a filter coupled between said first node and said second node, wherein said filter is not directly connected to a ground, wherein when there is no data transition, the voltage across said first node and said second node remains substantially unchanged, wherein when there is a data transition and if said clock signal and said data are out of phase synchronization, then the voltage across said first node and said second node changes.

11. A clock recovery apparatus according to claim 10, wherein said first differential charge pump includes:
a first resistor coupled to said first node;
a first NPN transistor coupled to said first node;
a second resistor coupled to said second node;
a second NPN transistor coupled to said second node and said first NPN transistor; and
a first current source coupled to said first and second NPN transistors,
wherein said second differential charge pump includes:
a third NPN transistor coupled to said first node;
a fourth NPN transistor coupled to said second node and said third NPN transistor; and
a second current source coupled to said third and fourth NPN transistors.

12. A clock recovery apparatus according to claim 10, wherein said first differential charge pump and second differential charge pump include Si and Ge.

13. A clock recovery apparatus according to claim 10, wherein said first differential charge pump and said second differential charge pump operate at a frequency greater than one GHz.

14. A clock recovery apparatus comprising:
(a) means for comparing a phase of data and a phase of a clock signal;
(b) means for detecting a transition in said data;
(c) means for producing a current through a first path including a first node and a current through a second path including a second node;
(d) means for changing the voltage across said first node and said second node when there is a data transition and if said clock signal and said data are out of phase synchronization;
(e) means for maintaining a voltage across said first node and said second node when there is no data transition;
(f) means for speeding up said clock signal when there is a transition in said data and if said clock signal is retarded in phase compared to said data;
(g) means for slowing down said clock signal when there is a transition in said data and if said clock signal is advanced in phase compared to said data; and
(h) means for maintaining a frequency of said clock signal when there is no transition in said data.

15. A clock recovery apparatus according to claim 14, wherein said (c) means includes a main differential charge pump and a compensating differential charge pump,
wherein said main differential charge pump includes said first node and said second node as its output nodes,
wherein said compensating differential charge pump includes said first node and said second node as its output nodes.

16. A clock recovery apparatus according to claim 14, wherein a frequency of said clock signal is greater than two GHz.

17. A clock recovery apparatus comprising:
(a) means for comparing a phase of data and a phase of a clock signal;
(b) means for detecting a transition in said data;
(c) means for producing a voltage across a double-ended filter;
(d) means for providing positive impedance coupled to said double-ended filter;
(e) means for providing negative impedance coupled to said double-ended filter; and
(f) means for providing said clock signal in response to said voltage.

18. A clock recovery apparatus according to claim 17, wherein a frequency of said clock signal is greater than two GHz.

19. A clock recovery apparatus comprising:
(a) means for comparing a phase of data and a phase of a clock signal;
(b) means for detecting a transition in said data;
(c) means for producing a first current;
(d) means for producing a second current;
(e) means for adding said second current to said first current when there is a transition in said data and if said data and said clock signal are out of phase synchronization;
(f) means for counterbalancing said second current with said first current when there is no transition in said data; and
(g) means for generating said clock signal in response to said first and second currents.

20. A clock recovery apparatus according to claim 19 further comprising means for producing a voltage across a filter in response to said first and second currents,
wherein said filter includes a first end and a second end,
wherein when there is no transition in said data, the differential voltage level at said first end and said second end remains substantially unchanged,
wherein when there is a transition in said data and if said data and said clock signal are out of phase synchronization, the differential voltage level at said first end and said second end changes,
wherein a frequency of said clock signal is greater than one GHz.

21. A clock recovery apparatus comprising:
a phase detector for comparing data and a clock signal;
a control circuit for detecting a transition in said data, said control circuit coupled to said phase detector;
a first charge pump for producing a first current, said first charge pump coupled to said phase detector; and
a second charge pump for producing a second current, said second charge pump coupled to said control circuit and said first charge pump,
wherein a frequency of said clock signal is increased when there is a transition in said data and if said clock signal is retarded in phase compared to said data,
wherein the frequency of said clock signal is decreased when there is a transition in said data and if said clock signal is advanced in phase compared to said data,
wherein the frequency of said clock signal is substantially unchanged when there is no transition in said data.

22. A clock recovery apparatus according to claim 21, wherein the frequency of said clock signal is greater than one GHz.

23. A clock recovery apparatus according to claim 21 further comprising:
- a filter coupled to said first charge pump;
- a voltage controlled oscillator for generating said clock signal, said voltage controlled oscillator coupled to said filter.

24. A method for recovering a clock signal, said method comprising:
- (a) receiving data and a clock signal;
- (b) detecting a transition in said data;
- (c) comparing a phase of said data and a phase of said clock signal;
- (d) producing a first current through a first current path,
- (e) producing a second current through a second current path,
- (f) speeding up said clock signal when there is a transition in said data and if said clock signal is retarded in phase compared to said data;
- (g) slowing down said clock signal when there is a transition in said data and if said clock signal is advanced in phase compared to said data; and
- (h) maintaining a frequency of said clock signal when there is no transition in said data.

25. A method according to claim 24,
wherein said steps of (d) and (e) further comprising:
- adding said first current to said second current when there is a transition in said data and if said clock signal and data are out of phase synchronization;
- compensating said first current with said second current when there no transition in said data.

26. A method according to claim 24,
wherein said steps of (d) and (e) further comprising:
- producing a charging current to a first node of a filter connected between said first current path and said second current path when there is a data transition and if said clock signal is behind in phase compared to said data;
- producing a discharging current to a second node of said filter when there is a data transition and if said clock signal is ahead in phase compared to said data;
- producing a change in the differential voltage across said filter when there is a data transition and if said clock signal and said data are out of phase synchronization;
- producing no charging or discharging current to said filter when there is no data transition; and
- maintaining the differential voltage across said filter during a no data transition period.

27. A method according to claim 24 further comprising: producing negative impedance.

28. A method according to claim 24, wherein a frequency of said clock signal is greater than two GHz.

* * * * *